United States Patent
Yamada et al.

[19]

[11] Patent Number: 5,808,313
[45] Date of Patent: Sep. 15, 1998

[54] CHARGED PARTICLE BEAM EXPOSURE METHOD AND CHARGED PARTICLE BEAM EXPOSURE APPARATUS

[75] Inventors: Akio Yamada; Hiroshi Yasuda; Hidefumi Yabara; Atsushi Saito, all of Kawasaki, Japan

[73] Assignee: Fujitsu Limited, Kanagawa, Japan

[21] Appl. No.: 892,976

[22] Filed: Jul. 15, 1997

[30] Foreign Application Priority Data

Feb. 13, 1997 [JP] Japan .................................. 9-029079

[51] Int. Cl.$^6$ ...................................................... H01J 37/00
[52] U.S. Cl. ........................ 250/492.23; 250/492.22; 250/398
[58] Field of Search ........................... 250/492.23, 492.22, 250/398

[56] References Cited

U.S. PATENT DOCUMENTS

5,391,886  2/1995  Yamada et al. ..................... 250/492.22

*Primary Examiner*—Kiet T. Nguyen
*Attorney, Agent, or Firm*—Armstrong, Westerman, Hattori, McLeland & Naughton

[57] ABSTRACT

The object of the present invention is to ensure a correct exposure even when a single exposure apparatus is used to expose a predetermined pattern, and an exposure apparatus therefor. According to the present invention, a charged particle beam exposure method, wherein a charged particle beam having a predetermined shape is irradiated to a sample to have the surface of the sample be exposed, comprises the steps of: storing a record of a first quantity of reflected electrons or a first sample current, which is detected in accordance with the charged particle beam irradiatd to the sample when a first exposure pattern is formed in a first area of the sample; and comparing a second quantity of reflected electrons or a second sample current, which is detected in accordance with the charged particle beam irradiated to the sample when the first exposure pattern is formed in a second area of the sample, with the first quantity of the reflected electrons or the first sample current which is stored when the first area is exposed, and generating a matched or unmatched signal therefor.

7 Claims, 5 Drawing Sheets

CHARGED PARTICLE BEAM EXPOSURE METHOD AND CHARGED PARTICLE BEAM EXPOSURE APPARATUS

BACKGROUND OF THE INVENTION

1. Field of the Invention

The present invention relates to a method for exposing a sample, such as a semiconductor wafer, to a charged particle beam, such as an electron beam or an ion beam, to form an extremely fine pattern thereon, and to an apparatus therefor.

2. Related Arts

An extremely fine pattern must be formed for the next generation of semiconductor devices, such as 256 M DRAMs or 1 G DRAMs, in order to provide increased integration. An extremely fine pattern on the order of several tenths of µm is required. Exposure apparatuses up to now having been widely employed can not be used for the exposure of such fine patterns. Therefore, a charged particle beam exposure method is required whereby for the exposure process wherein the surface of a wafer can be directly irradiated by a charged particle beam, such as an electron beam.

When a highly integrated semiconductor device, such as is described above, is to be exposed by employing a charged particle beam apparatus, the required number of exposure shots for each chip is several hundreds of Megas to several tens of Gigas. This enormous number of exposure shots must be accurately irradiated with a constant intensity, at a position selected by using exposure data. In addition, the exposure apparatus, to perform the exposures, must deflect a beam having a predetermined shape to a predetermined position in accordance with an exposure pattern. When a wafer is directly irradiated by a beam, an inspection to determine whether an exposed pattern is accurately exposed as its design value is not conducted at the exposure; but only after a device has finally been completed, it is examined by checking its characteristic.

The present inventors proposed an exposure confirmation method wherein, signals generated by the individual exposure apparatuses are sequentially compared while plural exposure apparatuses perform same exposure steps. When the signals from the apparatuses are different each other, then it is assumed that a correct exposure was not performed at either apparatus. This method is disclosed, for example, in Japanese Patent Application No. Hei 7-81448 (filed on Apr. 6, 1995).

The above described exposure confirmation method, however, is used only when the same pattern is constantly used for the exposure of a plurality of wafers. Since a single exposure apparatus is driven merely for the exposure of a single wafer, the method involving the comparison of various physical values and signal values for a plurality of exposure apparatuses can not be applied. Further, the above exposure confirmation method requires the constant employment of a plurality of exposure apparatuses, and the application of the method is thereby limited. In addition, the above exposure confirmation method can not be employed in a case where a plurality of exposure apparatuses expose different patterns in accordance with a large number of variety of designs but small quantities.

SUMMARY OF THE INVENTION

It is, therefore, one object of the present invention to provide a charged particle beam apparatus whereby a correct exposure is ensured, even when a single exposure apparatus is used to expose a predetermined pattern, and an exposure apparatus therefor.

To achieve the above object, according to the present invention, a charged particle beam exposure method, wherein a charged particle beam having a predetermined shape is irradiated to a sample to have the surface of the sample be exposed, comprises the steps of:

storing a record of a first quantity of reflected electrons or a first sample current, which is detected in accordance with the charged particle beam irradiatd to the sample when a first exposure pattern is formed in a first area of the sample; and comparing a second quantity of reflected electrons or a second sample current, which is detected in accordance with the charged particle beam irradiated to the sample when the first exposure pattern is formed in a second area of the sample, with the first quantity of the reflected electrons or the first sample current which is stored when the first area is exposed, and generating a matched or unmatched signal therefor.

More specifically, according to the above invention, at the irradiation step, the charged particle beam is irradiated to the sample in response to a predetermined irradiation pulse signal; the first quantity of the reflected electrons or the first sample current is a first signal value so obtained that a signal acquired by integrating the detected first quantity of the reflected electrons or the first sample current with a predetermined time constant is sampled at a sampling timing longer than a period for the predetermined irradiation pulse signal; and at the comparison step, the first signal value is compared with a second signal value obtained by sampling, at the sampling timing, a signal acquired by integrating the second quantity of the reflected electrons or the first sample current with the predetermined time constant.

According to the present invention, whether or not a correct exposure has been performed can be determined by comparing values according to the beam quantity which are detected at the exposure steps with the same exposure pattern performed at different times.

In addition, to achieve the above object, according to another present invention, a charged particle beam exposure method, wherein a charged particle beam having a predetermined shape is irradiated to a sample to have the surface of the sample be exposed, comprises the steps of: at an exposure step of irradiating the charged particle beam to the surface of the sample according to an exposure pattern data, calculating an anticipated value for a quantity of electrons reflected from the sample or for a sample current based on the exposure pattern data;

comparing a quantity of reflected electrons or a sample current, which is detected in accordance with the charged particle beam irradiated to the sample, with the acquired anticipated value for the quantity of reflected electrons or for the sample current; and generating a matched or unmatched signal therefor.

According to the present invention, the value in accordance with the beam quantity is calculated in real time based on the exposure pattern data, and the acquired value is compared with an actually detected value so that whether or not the exposure has been correctly performed can be determined.

DETAILED DESCRIPTION OF THE PREFERRED EMBODIMENTS

The preferred embodiments of the present invention will now be described while referring to the accompanying drawings. The technical scope of the present invention, however, is not limited to that of the embodiments.

[General Structure of Charged Particle Beam Exposure Apparatus]

Figure 1:
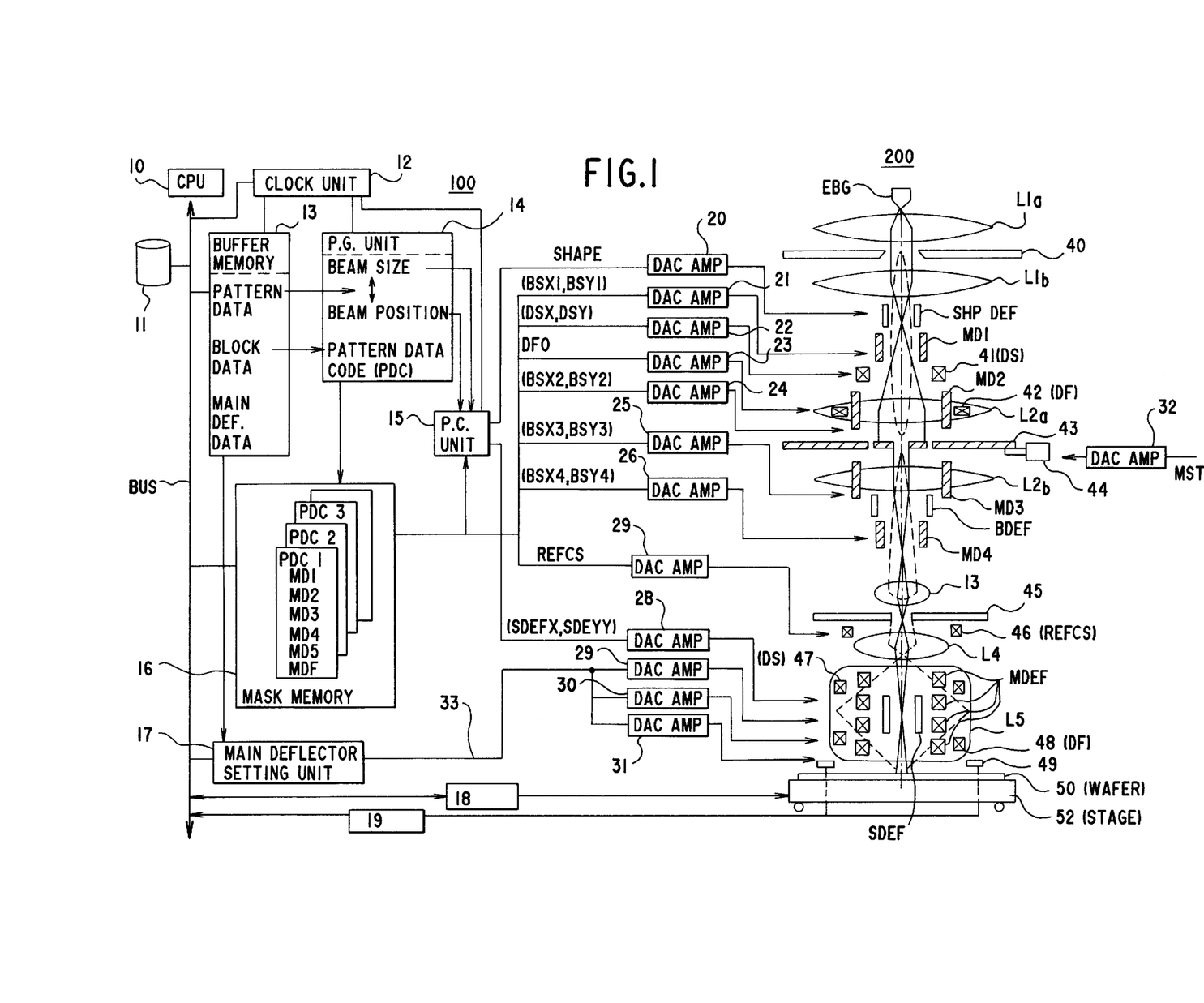
FIG. 1 is a diagram illustrating a general structure of an electron beam exposure apparatus, which is an example of a charged particle beam exposure apparatus.

FIG. 1 is a diagram illustrating a general structure of an electron beam exposure apparatus, which is one example of a charged particle beam exposure apparatus. Although the present invention can be applied not only for an electron beam but for other charged particle beams, an electron beam exposure apparatus is employed as an example to describe the embodiments of the present invention.

In FIG. 1, an exposure controller 100 performs data calculations to convert exposure data to driving data for driving individual components, and controls the entire exposure apparatus. A column 200 is an electronic optical system for an electron beam.

First, the column 200 will be briefly explained. An electron beam generated by an electron gun EBG passes through a first transparent mask(aperture) 40 via two electromagnetic lenses L1a and L1b. Thus, the electron beam is shaped like a rectangle, for example. After passing through a shaping deflector SHPDEF which delicately deflects the beam, the rectangular electron beam is deflected by four mask deflectors MD1 through MD4 and passes through a block mask at a desired position on a second transparent mask 43.

The second transparent mask 43 is a block mask wherein are formed, for example, a plurality of repeated pattern holes and a rectangular hole for variable rectangles. For pattern selection, the mask deflectors MD1 and MD2 deflect the electron beam to a position of a desired pattern. The beam passed the mask pattern is returned to an optical axis of the column by the convergent action of lenses L2a and L2b and by the mask deflectors MD3 and MD4. For the block mask, a plurality of deflection areas (e.g., about 5 mm×5 mm) are formed on a rectangular mask of, for example, 50 mm×50 mm, and a plurality of repeated mask pattern holes are formed in the individual deflection areas, as is described in the Japan Journal of Applied Physics Vol. 32 (1993) 6006. As is described above, one of the mask patterns is selected by the mask deflectors M1 through MD4. A DS 41 is a aberation correction coil for dynamically correcting for astigmatism in accordance with the deflection position on the second transparent mask 43, and a DF 42 is a correction coil for dynamically compensating for focal distance in accordance with the deflection position. The second transparent mask 43 is mounted on a mask stage 44 which can be moved horizontally.

In this manner, a sample 50, such as a wafer, mounted on a sample stage 52 is irradiated by a beam, which is shaped in a desired pattern, via a reducing lens L3 and projecting lenses L4 and L5. A main deflector MDEF, which is constituted by an electromagnetic deflector, and a sub-deflector SDEF, which is constituted by an electrostatic deflector, are provided to deflect a beam to a desired position on the sample 50. The main deflector MDEF is constituted by an electromagnetic deflector, which can deflect a beam at a large distance though its setting time is comparatively long, and the sub-deflector SDEF is constituted by an electrostatic deflector, which can deflect a beam at a small distance even though its setting time is comparatively short. A DS 47 is a correction coil for dynamically coorecting for astigmatism in accordacne with a beam deflection distance on the sample 50, and a DF 48 is a correction coil for dynamically correcting for a focal distance in consonance with a deflection distance.

A BDEF is a blanking deflector for turning on and off a beam with which the sample is to be irradiated, and a round aperture 45 is employed to control a diaphragm. A refocusing coil 46 refocuses an electron beam in accordance with the size of a selected mask pattern on the second transparent mask 43. When the mask pattern is large, the quantity of the electron beam is increased, and accordingly, the shape of the beam on the sample 50 becomes blurred due to the interaction between the electrons. The refocusing coil is used to compensate for such phenomenon. A detection element 49 is provided over the sample 50 to detect reflected electrons generated when a reference mark on the sample 50 or stage 44 is irradiated.

The above described deflectors and correction coils, and the mask stage and the other actuators are driven by analog drive signals provided by digital/analog conversion and amplification units DAC/AMPs 28 through 31. A digital drive signal is generated by the exposure controller 100 and transmitted to the digital/analog conversion and amplification units DAC/AMPs 28 through 31.

In the exposure controller 100, a central processing unit CPU 10 is connected via a bus BUS with a hard disk 11, a clock unit 12, a buffer memory 13, a pattern generation unit 14, a mask memory 16, a main deflector setting unit 17, a sample stage control unit 18, and a reflected electron detection unit 19.

On the hard disk 11 are stored exposure data, a calculation program for converting exposure data into drive data for controlling the individual actuators, and an exposure control program. The exposure data on the hard disk 11 is read into the buffer memory 13.

The exposure data roughly comprises pattern data, block data, main deflector data and stage data. The pattern data is constituted by the size of the beam and the irradiation location on the sample. Thus, the pattern data is converted into drive data SHAPE for the shaping deflector SHPDEF, which is used to set the position at which the electron beam passing through the first transparent mask overlaps the rectangular hole on the second transparent mask, and into the drive data (SDEFx, SDEFy) for the sub-deflector SDEF.

The block data is necessary particularly when the block mask shown in FIG. 1 is used as the second transparent mask 43, and such data has pattern data code (PDC) indicating a pattern on the block mask to be selected. When pattern data code is selected, deflection data (BSX1, BSY1) through (BSX4, BSY4) for the mask deflectors MD1 through MD4, which are registered in advance in accordance with the selected pattern data code, astigmatism correction data DS (DSX, DSY) and focus correction data DFO, which correpond to the deflection quantity, mask stage drive data MST, and data Refcs for the refocusing coil 46 are read from the mask memory 16.

The main deflector data 33 is data used for driving the main deflector MDEF, and includes the deflection data for the main deflector MDEF, the correction data DS for the astigmatism correction coil 47, and the correction data for the focus correction coil 48, which correspond to the amount of deflection. The stage data are data for driving the sample stage 52.

From among the exposure data that are read into the buffer memory 13, the pattern data and the block data are transmitted to the pattern generation unit 14, which in turn generates data for driving the individual actuators, i.e. deflectors or coils, that control the electron beam used to irradiate the sample 50. The pattern correction unit 15 receives data specifying a beam size and a position in the sub-deflection area, and performs correction calculation for converting the data into coordinates in the delectors of the optical system 200 that correspond to an actual position on the sample 50. Then, the drive data obtained by the correction unit 15 are transmitted to the digital/analog conversion and amplification units 20 and 28 provided for the correponding individual actuators. The shaping deflector SHP-DEF and the sub-deflector SDEF are driven in accordance with the resultant analog drive signals.

The pattern generation unit 14 generates pattern data code PDC corresponding to the block data in the exposure data, and reads, in accordance with the code PDC, drive data which are registered and stored in advance in the mask memory 16. The digital drive signals are transmitted to the respective digital/analog conversion and amplification units 21 through 26, 29 and 32. The correponding actuators are driven by analog drive signals generated by the digital/analog conversion and amplification units 21 through 26, 29 and 32.

The sample stage control unit 18 is a driver and position detector for controlling the movement of the sample stage 52, and the reflected electron detection unit 19 is means for processing a detection signal from the reflected electron detector 49.

Figure 2:
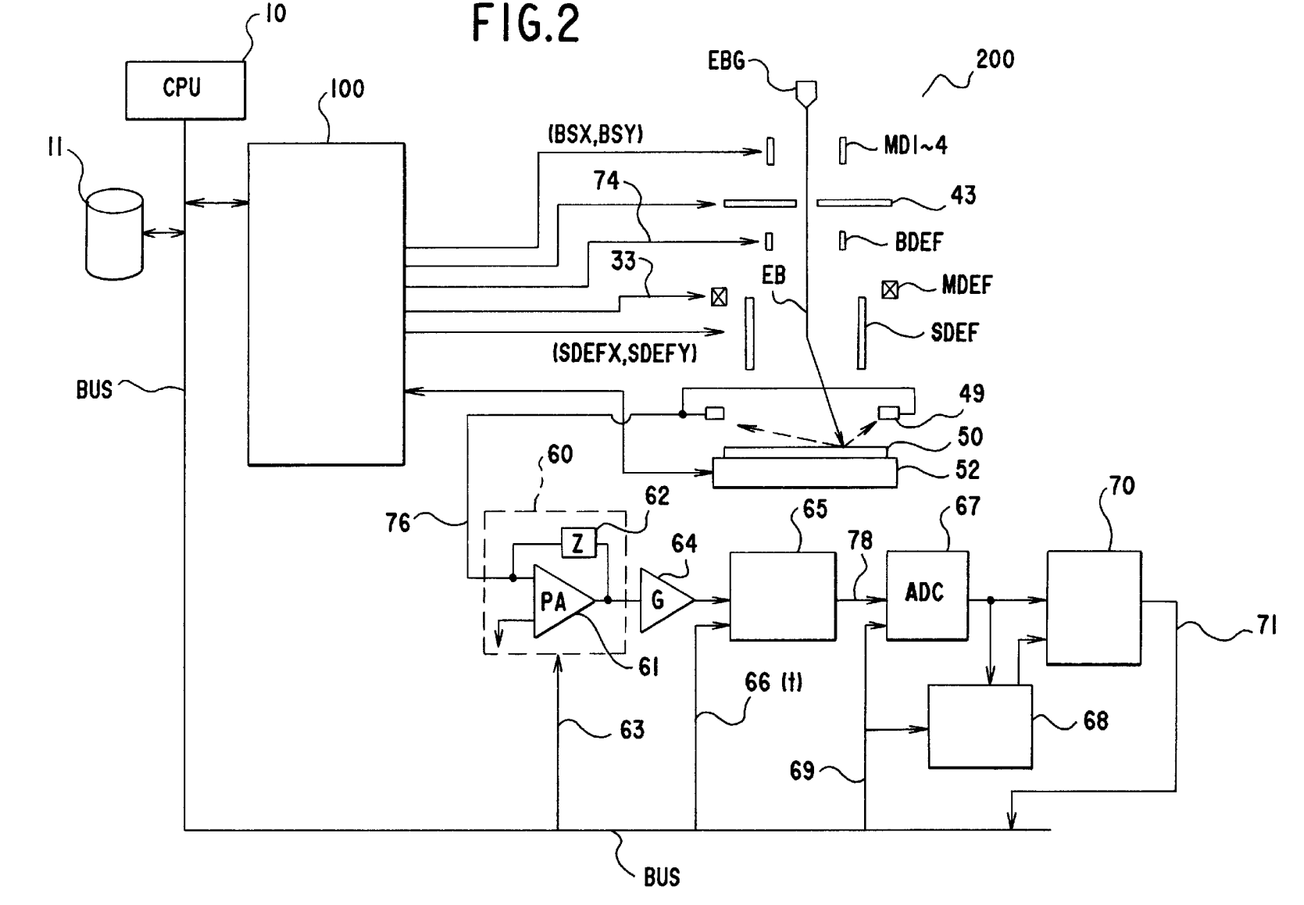
FIG. 2 is a diagram illustrating a circuit structure of the electron beam exposure apparatus for ensuring a correct exposure according to one embodiment of the present invention.

FIG. 2 is a diagram illustrating a circuit structure for ensuring a correct exposure by the above electron beam exposure apparatus. The CPU 10, the exposure controller 100, the electron beam column 200 and the hard disk 11 are the same as those in FIG. 1, and are only partially shown. For the column 200, the mask deflectors MD1 through MD4 and the main deflector MDEF are briefly shown in FIG. 2.

The structure for ensuring a correct exposure in this embodiment has a preamplification circuit 60, an amplifier 64, a signal integrator 65, an analog/digital converter 67, a memory 68, and a comparator 70. The sample 50, such as a wafer, is irradiated by the electron beam EB emitted by the electron beam gun EBG, and the electrons that are accordingly reflected are detected by the reflected electron detection unit 49. The reflected electron detection unit 49 transmits, as a current value, the intensity of the reflecture electrons, which are reflected in accordance with the intensity of the electron beam EB, to the preamplification circuit 60. The preamplification circuit 60 is constituted by a preamplifier 61 and a feedback resistor 62, and is given an appropriate gain and an offset signal 63 from the CPU 10.

The preamplification circuit 60 converts a received current value into a voltage value and supplies it to the amplifier 64. The voltage value is, therefore, a value in accordance with the quantity of reflected electrons. The voltage value amplified by the amplifier 64 is supplied to the signal integrator 65. The signal integrator 65 integrates the received voltage value by using a time constant τ designated by the CPU 10. The time constant τ is transmitted as a signal 66 via the bus BUS by the CPU 10. The range of the time constant τ is, for example, on the order of from 5 to 20 μsec.

The signal integrator 65 divides a cumulative value of the current values detected in accordance with the quantity of reflected electrons, by the time required for the cumulation to generate the average current value 78. As a result, an integral value for a pulse signal, the level of which corresponds to the quantity of the reflected electrons detected in a pulse shape by the reflected electron detection unit 49 can be generated. The generated average current value 78 is supplied to the analog/digital converter 67, and is converted into a digital signal at a timing for a predetermined sampling signal 69. The obtained digital signal is sequentially stored in the memory 68.

When the wafer 50 is directly exposed by the electron beam exposure apparatus, the same pattern is drawn in a plurality of chip areas on the wafer 50. In this embodiment, with respect to the exposure pattern repeatedly drawn, the average current value, which corresponds to the quantity of the reflected electrons detected at the first exposure, is stored in the memory 68. When the same exposure pattern is to be drawn in another chip area, the current average value previously stored in the memory 68 is compared with the average current value currently detected during the exposure by the comparator 70. Drawing the same exposure pattern, the two values always match so long as the exposure is correctly performed. If some exposure failure occurs during the exposure with the electron beam, however, a comparison signal 71 indicating that the two average current values differ is output by the comparator 70.

Figure 3:
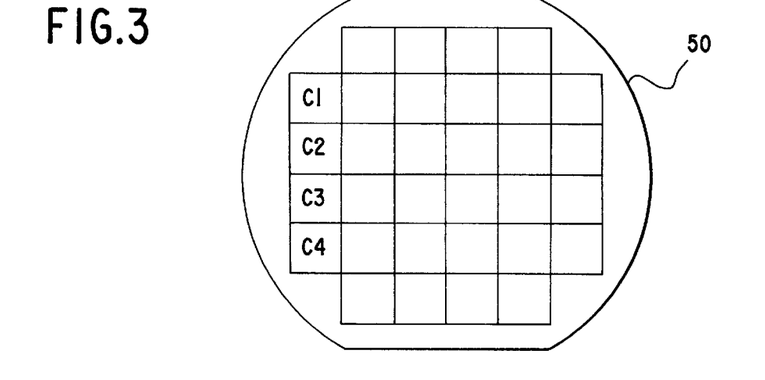
FIG. 3 is a diagram for explaining a step-and-repeat method.

FIG. 3 is a diagram for explaining the step-and-repeat method. As is shown in FIG. 3, chip areas, such as C1, C2 and C3, are arranged in a matrix shape on the wafer 50. The same exposure pattern is drawn in the chip areas C1, C2, C3 and C4. In the correct exposure ensuring circuit in FIG. 2, therefore, the average of current values, which correspond to the intensity of the secondary electrons generated to expose the chip area C1, is generated by the signal integrator 65, and its analog signal 78 is digitized by sampling with the sampling signal 69. The resultant digital signal is then stored in the memory 68. To expose the following chip areas C2, C3 and C4, the average current value stored for the exposure of the chip area C1 is read from the memory 68, and is compared by the comparator 70 with the average current value that corresponds to the intensity of the electrons reflected during the following exposure, and that is obtained by sampling with the same sampling signal 69. Therefore, so long as the average current values, which correspond to the quantities of the reflected electrons detected during the different exposure procedures performed at different times, are shown to match as the result of the comparison performed by the comparator 70, the correct performance of the electron beam exposure is ensured.

Figure 4A:
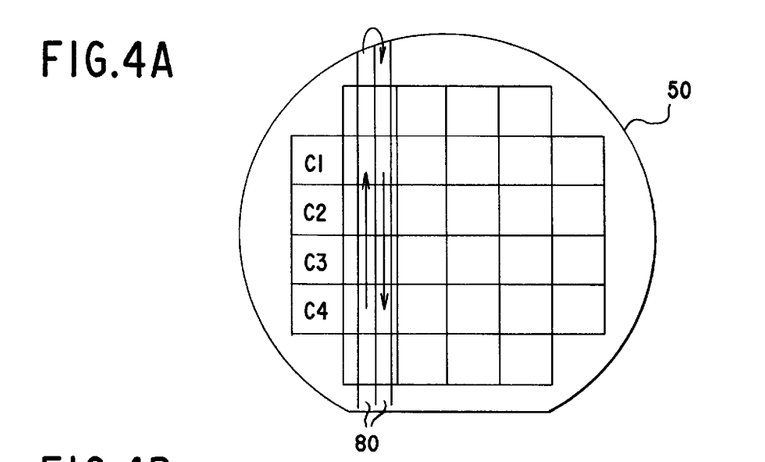
FIG. 4 is a diagram for explaining a continuous moving method wherein exposure is performed while a stage is continuously moved.
Figure 4B:
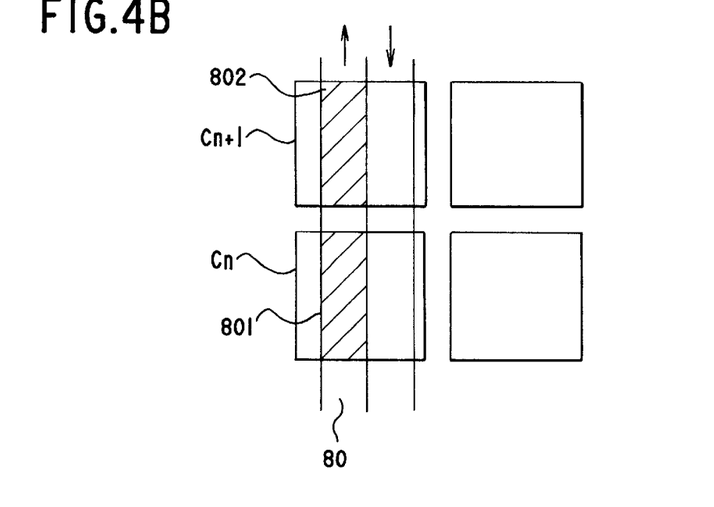

FIGS. 4A and 4B are diagrams for explaining the continuous moving method wherein the electron exposure is performed while continuously moving the stage. FIG. 4A is a diagram showing the relationship in the continuous moving method between a frame 80 and the chip areas, such as C1 and C2, on the wafer 50. The frame 80 has a width, with which the main deflector MDEF can deflect the electron beam on the wafer, and is an exposure area band parallelly moving along the rows of chips. As is indicated by the arrows in FIG. 4A, the exposure area can be moved vertically. Since the stage moving method does not include a procedure for temporarily halting the stage, as in the step-and-repeat method, the adjustment time that accompanies the halting of the stage can be eliminated, and the throughput for the electron beam exposure procedure can be improved.

FIG. 4B is a detailed diagram showing the relationship between chip areas $C_n$ and $C_{n+1}$, and the frame 80. Since the width of the frame 80 is smaller than that of the chip area $C_n$, $C_{n+1}$, areas 801 and 802 serve as the comparison exposure areas in FIG. 2. More specifically, when the exposure is performed along the frame 80, a sampling signal for the average current value detected when the area 801 in the chip area $C_n$ is exposed is stored in the memory 68. In the exposure procedure for the area 802, which follows the exposure of the area 801, the sampling signal stored during the exposure of the area 801 is compared by the comparator 70 with a sampling signal for the average current value detected during the exposure of the area 802. With the stage moving method, therefore, the number of sampling signals stored in the memory 68 is fewer than the number stored for the step-and-repeat method, and the capacity of the memory 68 can be reduced.

Figure 5:
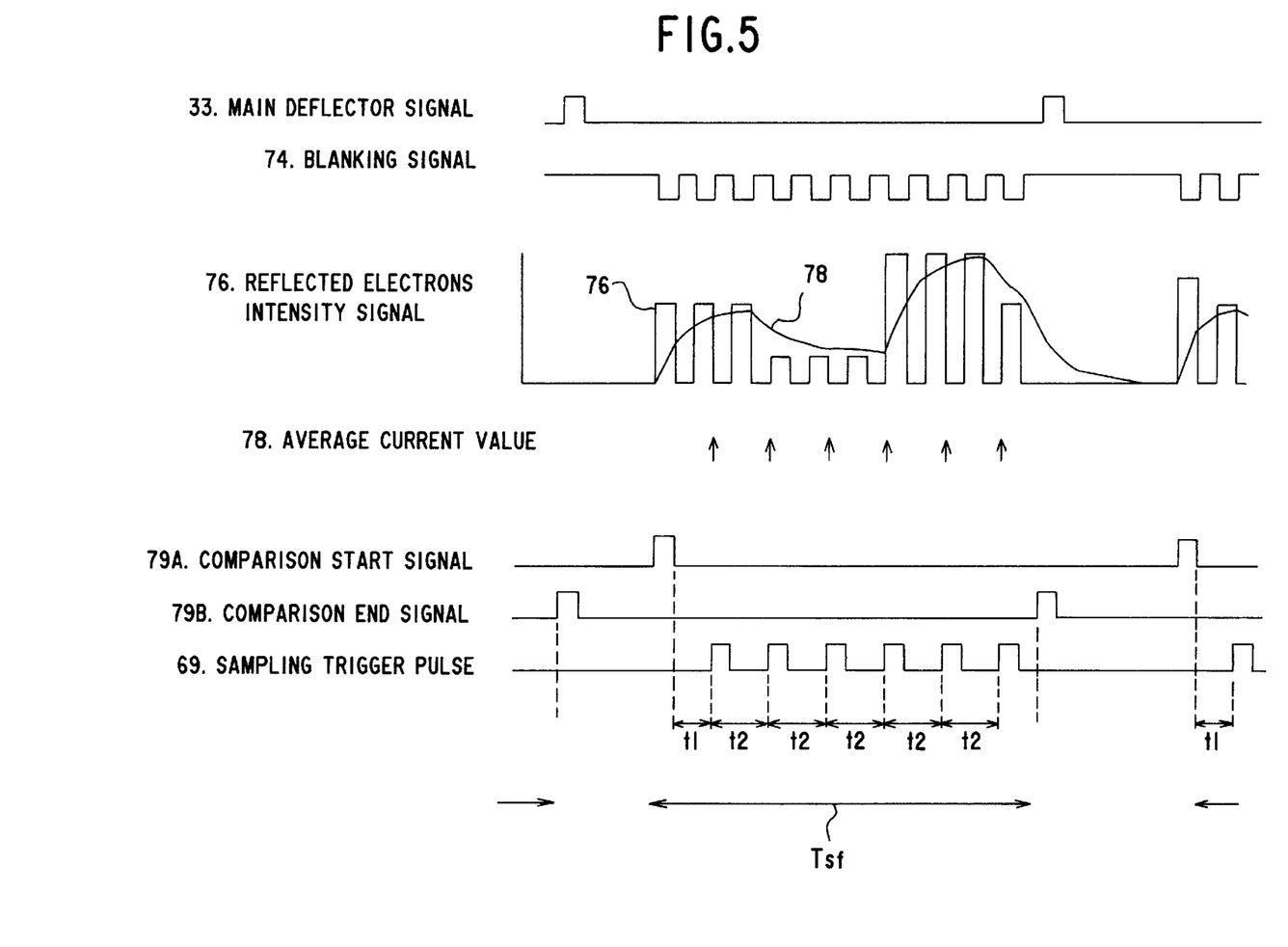
FIG. 5 is a timing chart for individual signals in the correct exposure ensuring circuit in FIG. 2.

FIG. 5 is a timing chart for the individual signals in the correct exposure ensuring circuit in FIG. 2. In this timing chart are shown a setting pulse of a main deflector signal 33, a blanking signal 74 supplied to the blanking deflector BDEF, a current value 76 detected by the reflected electron detection unit 49, and an average current value 78 generated by the integrator 65. In this example timing chart, the wafer 50 is irradiated by the electron beam EB during a period in which the main deflector signal 33 is at level L, in accordance with the pulses of the blanking signal 74. That is, the timing for the L level pulses of the blanking signal 74 corresponds to the timing for electron beam shots that strike the sample. Therefore, synchronously with the pulses of the blanking signal 74, the reflected electron detection unit 49 supplies the preamplification circuit 60 with the detected current pulses 76, the height of which corresponds to the intensity of the electron beam.

An integral value 78 corresponding to a predetermined time constant τ is generated by the signal integrator 65 as shown in FIG. 5. The pulse width of the blanking signal 74 is short, e.g., several hundreds of nsec, and the number of the pulse signals is enormous, as was previously described. It is, therefore, not practical to store and compare all of the values (heights) of the detected current pulses 76, which correspond to the reflected electron signal intensities detected in accordance with the above pulse signals, because of the huge memory capacity and the immense number of comparison procedures that would be required. In this embodiment, therefore, the integrator 65 generates an integral value in accordance with the time constant τ, and digital signals for the output 78 at the sampling timings indicated by the arrows in FIG. 5 are stored in the memory 68. The sampling period is, for example, on the order of several μsec. The comparatively small capacity memory 68 can be used, and the number of comparison procedures can be reduced.

A sampling trigger pulse 69, which is supplied to the analog/digital converter 67 and the memory 68 where the comparison signal is stored, is shown In FIG. 5. A comparison start signal 79A is generated with, as a starting point, the first pulse of the blanking signal 74 in sub-field exposure period Tsf, and an end signal 79B is generated at the termination of the sub-field exposure period Tsf. The sampling trigger signal 69 is generated between the comparison start signal 79A and the comparison end signal 79B at a predetermined interval t2, a constant interval of 5 to 10 μsec, for example. In accordance with the sampling trigger pulse 69, the analog/digital converter 67 performs sampling of the output 78 of the signal integrator 65, and generates a digital signal. The analog/digital converter 67 requires, for example, 1 μsec or less for obtaining the digital signal value from the sampling trigger pulse. When the digital value is established, it is stored in the memory 68, or is employed for comparison at the comparator 70.

Figure 6:
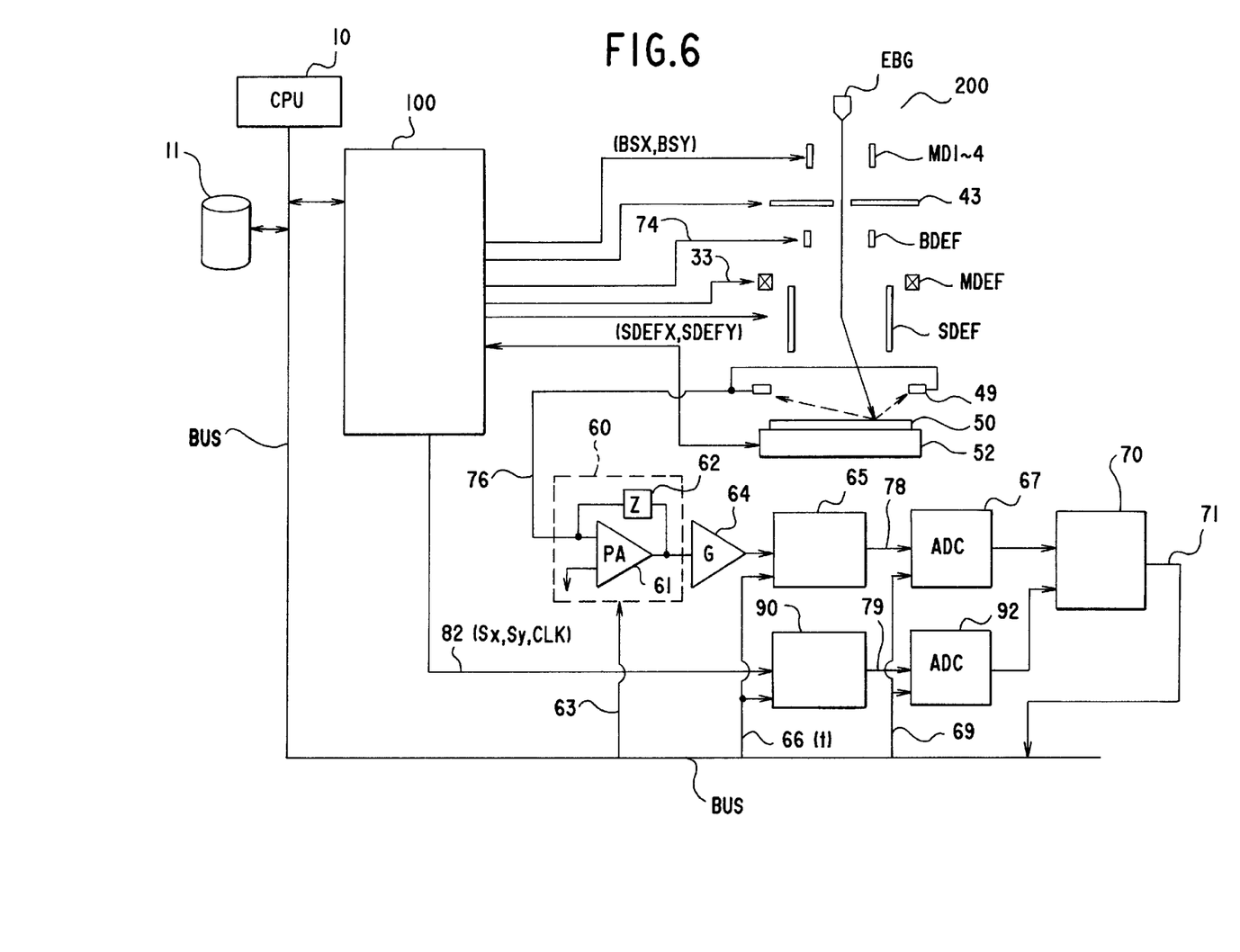
FIG. 6 is a diagram illustrating a structure of a correct exposure ensuring circuit according to another embodiment of the present invention.

FIG. 6 is a diagram illustrating a structure of a correct exposure ensuring circuit according to another embodiment of the present invention. With the structure of the correct exposure ensuring circuit in the above first embodiment, the average value for the reflected electron quantities detected during the first exposure is stored in the memory 68, and is compared by the comparator 70 with the average value for the reflected electron quantities detected during a procedure, involving the exposure of the same pattern, that is performed later. In the embodiment in FIG. 6, a predicted value for the average value of the reflected electron quantities is calculated in real time using the exposure pattern in the exposure procedure, and the obtained value is compared by the comparator 70 with the average value of the quantities of electrons that are actually reflected when the wafer 50 is irradiated.

As is shown in FIG. 6, a signal 82 required to predict the average quantity of reflected electrons is supplied by the exposure controller 100 to the integrating circuit 90. The signal 82 includes, for example, signals Sx and Sy indicating the size of an electron beam to be used for irradiation and a period CLK according to which irradiation of the electron beam is performed. The irradiation period CLK corresponds, for example, to the pulse width of the blanking signal 74 in FIG. 5. A time constant 66 supplied to the signal integrator 65 is supplied to the integrating circuit 90 as well, which calculates the average current value by employing the signals Sx and Sy indicating the beam size, the clock width CLK, and the time constant τ as follows:

$$\text{Average current value} = \Sigma Sx \times Sy \times CLK/\tau.$$

The analog/digital converter 92 performs sampling, at the timing set by the sampling signal 69, for a predicted value 79 of the average current value that is generated as a result of integration in the integrating circuit 90, and generates a digital signal. If the integrating circuit 90 calculates the average current value in digital, then the analog/digital converter 92 may be omitted. Paralleling to this processing, the exposure controller 100 supplies drive signals to the individual actuators, i.g. deflectors, in the column 200, and the actual exposure of the wafer 50 occurs. As is explained while referring to FIG. 2, the reflected electrons are detected by the reflected electron detection unit 49, and the current value 76 is supplied via the preamplification circuit 60 and the amplifier 64 to the signal integrator 65. In accordance with the sampling signal 69, the analog/digital converter 67 performs sampling of the average current value 78 generated by the signal integrator 65, and outputs the digital signal. Therefore, the predicted value 79 for the average current value generated by the integrating circuit 90 is compared by the comparator 70 with the average value 78 for the current value that corresponds to the quantity of the reflected electrons detected during the actual exposure.

The comparator 70 determines whether the ratio for the two signals falls within or outside a predetermined range, and transmits a detection signal 71 to the CPU 10. When the detection signals 71 indicating the two signals differ are sequentially received from the comparator 70 a predetermined number of times or more, the CPU 10 assumes that an exposure error has occurred, and either generates an alarm or stores the number of the chip which is being exposed in the memory 68.

In the above embodiments, the quantity of the reflected electrons has been detected to determine the quantity of a charged particle beam. However, instead of the quantity of reflected electrons, a sample current is detected at a sample via a sample stage in accordance with the intensity of the charged particle beam employed for irradiation. Therefore, a sample current may be detected and a digital value obtained by sampling may be stored in the memory for employment as a comparison value. Further, a predicted value for the sample current may be calculated from exposure pattern data in real time, and can be compared with a sample current value that is detected.

As is described above, according to the present invention, correct exposure can be ensured by employing only one charged particle beam exposure apparatus.

What is claimed is:

1. A charged particle beam exposure method, wherein a charged particle beam having a predetermined shape is irradiated to a sample to have the surface of the sample be exposed, comprising the steps of:

storing a record of a first quantity of reflected electrons or a first sample current, which is detected in accordance with the charged particle beam irradiated to the sample when a first exposure pattern is formed in a first area of the sample; and comparing a second quantity of reflected electrons or a second sample current, which is detected in accordance with the charged particle beam irradiated to the sample when the first exposure pattern is formed in a second area of the sample, with the first quantity of the reflected electrons or the first sample current which is stored when the first area is exposed, and generating a matched or unmatched signal therefor.

2. A charged particle beam exposure method according to claim 1, wherein at the irradiation step, the charged particle beam is irradiated to the sample in response to a predetermined irradiation pulse signal;

the first quantity of the reflected electrons or the first sample current is a first signal value so obtained that a signal acquired by integrating the detected first quantity of the reflected electrons or the first sample current with a predetermined time constant is sampled at a sampling timing longer than a period for the predetermined irradiation pulse signal;

and at the comparison step, the first signal value is compared with a second signal value obtained by sampling, at the sampling timing, a signal acquired by integrating the second quantity of the reflected electrons or the second sample current with the predetermined time constant.

3. A charged particle beam exposure method, wherein a charged particle beam having a predetermined shape is irradiated to a sample to have the surface of the sample be exposed, comprising the steps of: at an exposure step of irradiating the charged particle beam to the surface of the sample according to an exposure pattern data, calculating an anticipated value for a quantity of electrons reflected from the sample or for a sample current based on the exposure pattern data;

comparing a quantity of reflected electrons or a sample current, which is detected in accordance with the charged particle beam irradiated to the sample, with the acquired anticipated value for the quantity of the reflected electrons or for the sample current; and generating a matched or unmatched signal therefor.

4. A charged particle beam exposure method according to claim 3, wherein said exposure pattern data includes at least data for a size of said charged particle beam and data for an irradiation period, and the anticipated value for said quantity of said reflected electrons or for said sample current is calculated according to a cumulative value of products of said size and said irradiation period.

5. A charged particle beam exposure method according to claim 3, wherein at the irradiation step, the charged particle beam is irradiated to the sample in response to a predetermined irradiation pulse signal;

the anticipated value for the quantity of the reflected electrons or for the sample current is a first signal value so obtained that a signal acquired by integrating the anticipated quantity of the reflected electrons or the anticipated sample current with a predetermined time constant is sampled at a sampling timing longer than a period for the predetermined irradiation pulse signal;

and at the comparison step, the first signal value is compared with a second signal value obtained by sampling, at the sampling timing, a signal acquired by integrating the detected quantity of the reflected electrons or the detected sample current with the predetermined time constant.

6. A charged particle beam exposure apparatus, wherein a charged particle beam having a predetermined shape is irradiated to a sample to have the surface of the sample be exposed, comprising:

means for storing a record of a first quantity of reflected electrons or a first sample current, which is detected in accordance with the charged particle beam irradiatd to the sample when a first exposure pattern is formed in a first area of the sample; and means for comparing a second quantity of reflected electrons or a second sample current, which is detected in accordance with the charged particle beam irradiated to the sample when the first exposure pattern is formed in a second area of the sample, with the first quantity of the reflected electrons or the first sample current which is stored when the first area is exposed, and for generating a matched or unmatched signal therefor.

7. A charged particle beam exposure apparatus, wherein a charged particle beam having a predetermined shape is irradiated to a sample to have the surface of the sample be exposed, comprising:

means for calculating an anticipated value for a quantity of electrons reflected from the sample or for a sample current based on an exposure pattern data at an exposure step of irradiating the charged particle beam to the surface of the sample according to the exposure pattern data;

means for detecting said quantitiy of the reflected electrons or the sample current in accordance with the charged particle beam irradiated to the sample at said exposure step; and means for comparing the detected quantity of reflected electrons or the detected sample current with the acquired anticipated value for the quantity of the reflected electrons or for the sample current, and generating a matched or unmatched signal therefor.

* * * * *